United States Patent
Wang et al.

(10) Patent No.: US 7,522,453 B1
(45) Date of Patent: Apr. 21, 2009

(54) NON-VOLATILE MEMORY WITH SOURCE-SIDE COLUMN SELECT

(75) Inventors: Zhigang Wang, Sunnyvale, CA (US);
Gregory Bakker, San Jose, CA (US);
Volker Hecht, Barshinghausen (DE);
Santosh Yachareni, San Jose, CA (US);
Fethi Dhaoui, Patterson, CA (US);
Vidyadhara Bellippady, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 7 days.

(21) Appl. No.: 11/961,134

(22) Filed: Dec. 20, 2007

(51) Int. Cl.
*G11C 16/04* (2006.01)

(52) U.S. Cl. .......................... 365/185.11; 365/185.13; 365/185.17

(58) Field of Classification Search ............. 365/185.11
See application file for complete search history.

(56) References Cited

U.S. PATENT DOCUMENTS

| | | | | |
|---|---|---|---|---|
| 5,583,808 A | * | 12/1996 | Brahmbhatt | ........... 365/185.05 |
| 5,748,538 A | * | 5/1998 | Lee et al. | ............... 365/185.06 |
| 5,977,584 A | * | 11/1999 | Kim | ............................ 257/315 |
| 6,084,794 A | * | 7/2000 | Lu et al. | ...................... 365/104 |
| RE37,419 E | * | 10/2001 | Hsu et al. | .............. 365/185.11 |
| 6,351,415 B1 | * | 2/2002 | Kushnarenko | ......... 365/185.18 |
| 6,496,405 B2 | * | 12/2002 | Hibino | ....................... 365/104 |
| 6,633,496 B2 | * | 10/2003 | Maayan et al. | ................ 365/63 |
| 6,744,667 B2 | * | 6/2004 | Yamamoto et al. | ..... 365/185.16 |
| 7,095,655 B2 | * | 8/2006 | Betser et al. | ........... 365/185.21 |
| 7,408,820 B2 | * | 8/2008 | Maruyama et al. | ..... 365/189.16 |
| 2005/0088878 A1 | * | 4/2005 | Eshel | .................... 365/185.28 |
| 2007/0014142 A1 | * | 1/2007 | Ng et al. | ....................... 365/94 |

* cited by examiner

*Primary Examiner*—Son L Mai
(74) *Attorney, Agent, or Firm*—Lewis and Roca LLP

(57) ABSTRACT

A non-volatile memory array segment includes an odd-select transistor having a drain coupled to an odd-source line and an even-select transistor having a drain coupled to an even-source line. Two segment-select transistors have drains coupled to the sources of different ones of the odd and even source lines, sources coupled to ground, and gates coupled to a segment-select line. A plurality of odd non-volatile memory transistors each has a drain coupled to a common drain line, a source coupled to the odd-source line, a floating gate, and a control gate. A plurality of even non-volatile memory transistors, each has a drain coupled to the common drain line, a source coupled to the even-source line, a floating gate, and a control gate. The control gate of each even non-volatile memory transistor is coupled to the control gate of a different one of the odd non-volatile memory transistors.

12 Claims, 3 Drawing Sheets

NON-VOLATILE MEMORY WITH SOURCE-SIDE COLUMN SELECT

BACKGROUND OF THE INVENTION

1. Field of the Invention

The present invention relates to integrated circuit non-volatile memories. More particularly, the present invention relates to non-volatile memory arrays having source-side column select architectures.

2. The Prior Art

Background leakage and gate-induced-drain-leakage (GIDL) stress is a serious issue in hot-carrier-injection programming schemes for flash memory devices and flash-based FPGA devices.

Prior-art designs employ a column select transistor at the drain side of the memory transistor. The column-select device is usually a high-voltage transistor which requires large-area well boundaries.

FIGS. 1A and 1B are simplified schematic diagrams illustrating representative prior-art flash memory programming techniques. In FIG. 1A, a drain-side column-select transistor is coupled to a flash memory transistor. The source side of the flash memory transistor is coupled to ground through a source bias resistor. To program the flash memory transistor, the gate of the drain-side column-select transistor is biased at about +8.5V, the gate of the memory transistor is biased at about +8.5V, and 5V is applied to the drain of the drain-side column-select transistor. As will be appreciated by persons of ordinary skill in the art, a sector-based column select scheme is usually employed.

In FIG. 1B, a drain-side column-select transistor is coupled to a flash memory transistor. The source side of the flash memory transistor is coupled to ground through a source-side select transistor. The column-select scheme is also sector based in this arrangement. To program the flash memory transistor, the gate of the drain-side column-select transistor is biased at about +0 v to +10V, the gate of the memory transistor is biased at about −20V to +20V, the gate of the source-select transistor is biased at about 0V to +15V, and 0V to +10V is applied to the drain of the drain-side column-select transistor.

The arrangements of FIGS. 1A and 1B have several drawbacks. The drain-side column select transistor must be a high-voltage transistor or a floating gate access transistor. This requires well spacing design rules for well boundaries between non-volatile memory wells to high voltage logic wells.

BRIEF DESCRIPTION OF THE INVENTION

A non-volatile memory array segment includes an odd-select transistor having a drain coupled to an odd-source line and an even-select transistor having a drain coupled to an even-source line. Two segment-select transistors have drains coupled to the sources of different ones of the odd and even source lines, sources coupled to ground, and gates coupled to a segment-select line. A plurality of odd non-volatile memory transistors each has a drain coupled to a common drain line, a source coupled to the odd-source line, a floating gate, and a control gate. A plurality of even non-volatile memory transistors each has a drain coupled to a common drain line, a source coupled to the even-source line, a floating gate, and a control gate. The control gate of each even non-volatile memory transistor is coupled to the control gate of a different one of the odd non-volatile memory transistors.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1A:
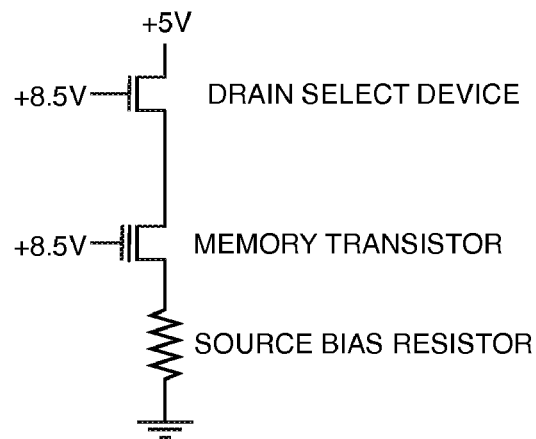
FIGS. 1A and 1B are simplified schematic diagrams illustrating representative prior-art flash memory programming techniques.
Figure 1B:
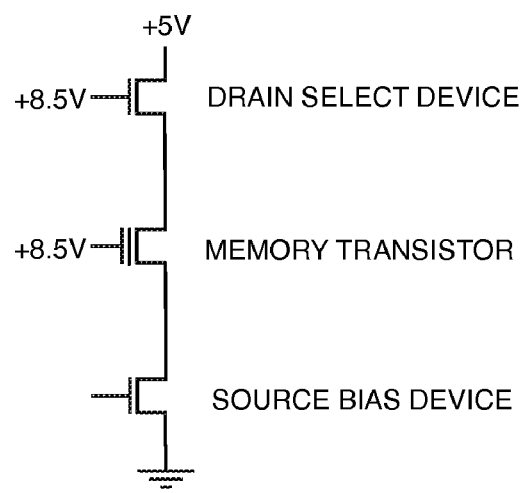
Figure 2:
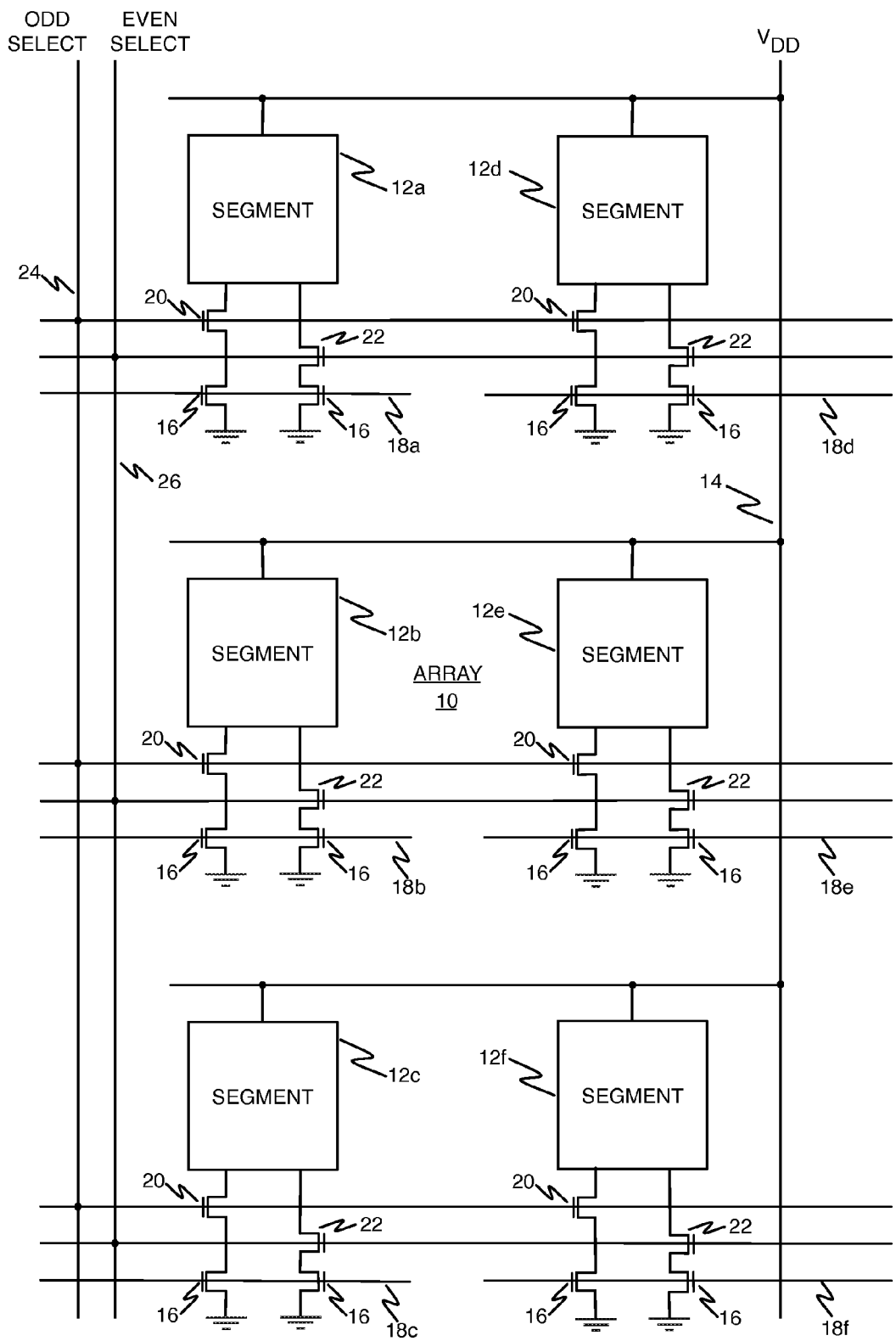
FIG. 2 is a block diagram of a portion of a segmented memory array according to the principles of the present invention.

Referring now to FIG. 2, a block diagram shows a portion of an illustrative segmented memory array 10 according to the principles of the present invention. As shown in FIG. 2, memory array 10 includes a plurality of memory segments. The embodiment of FIG. 2 shows six segments 12a, 12b, 12c, 12d, 12e, and 12f, but persons of ordinary skill in the art will appreciate that this is solely for the purpose of disclosing the present invention, and that the number of segments used in an actual memory array fabricated according to the principles of the present invention may have an arbitrary number of segments based on design choice.

Segments 12a through 12f are coupled to a common drain voltage supply line 14. Each segment has associated with it a pair of segment select transistors 16. The gates of the segment select transistors in memory segment 12a are coupled to a segment-select line 18a. The gates of the segment select transistors in memory segment 12b are coupled to a segment-select line 18b. The gates of the segment select transistors in memory segment 12c are coupled to a segment-select line 18c. The gates of the segment select transistors in memory segment 12d are coupled to a segment-select line 18d. The gates of the segment select transistors in memory segment 12e are coupled to a segment-select line 18e. The gates of the segment select transistors in memory segment 12f are coupled to a segment-select line 18f. Segment-select lines 18a through 18f may be individually driven from a decoder circuit as is known in the art.

Each segment 12a through 12f also has associated with it an odd-select transistor 20 and an even-select transistor 22. All of the odd-select transistors in the array 10 are driven from an odd-select line 24 and all of the even-select transistors 22 in the array 10 are driven from an even-select line 26.

Figure 3:
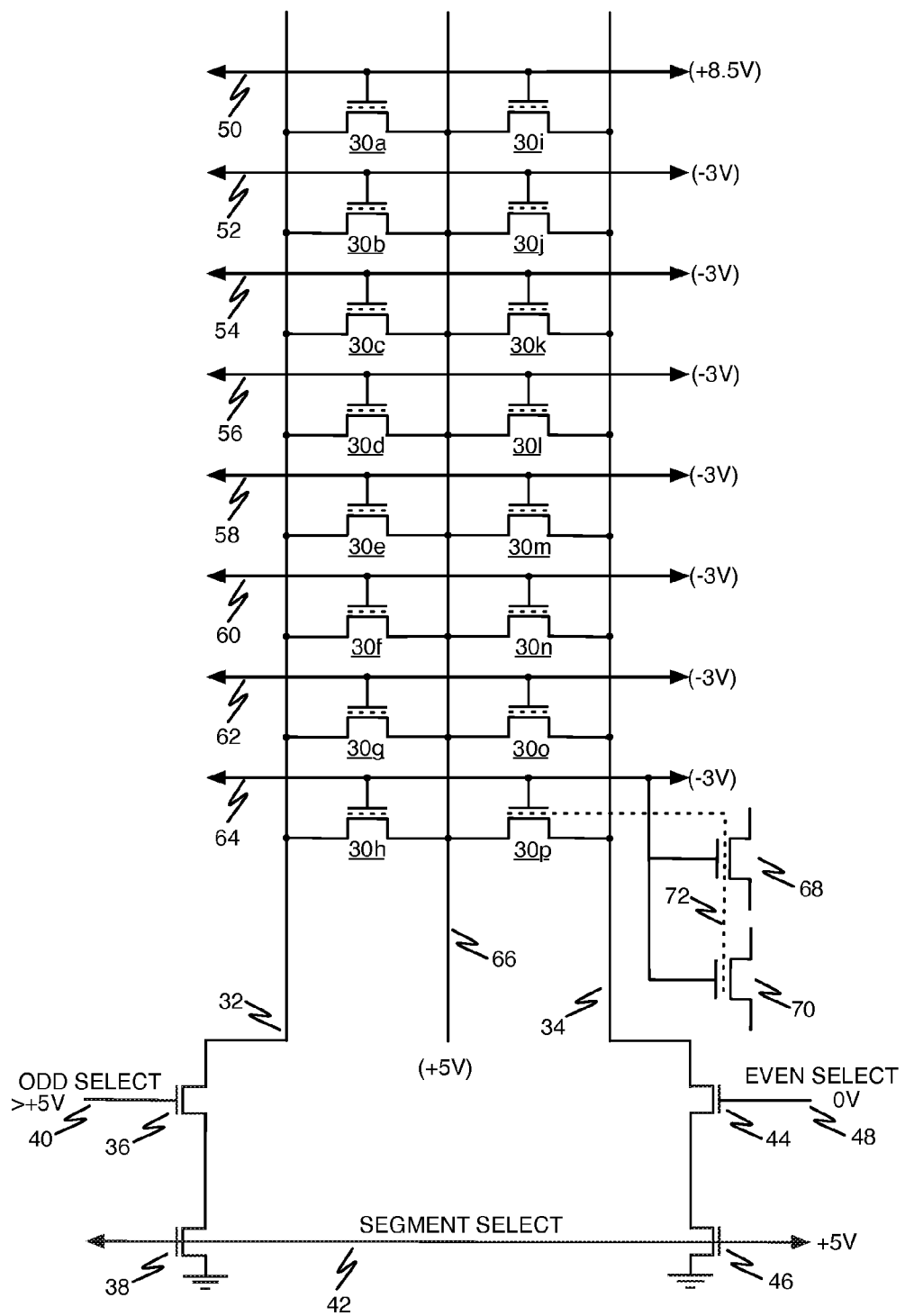
FIG. 3 is a schematic diagram of an illustrative one of the segments of the memory array of FIG. 2 according to the principles of the present invention.

Referring now to FIG. 3, a schematic diagram shows an illustrative one of the segments of the memory array of FIG. 2 with source-side select according to the principles of the present invention. The circuit uses medium-voltage transistors for channel hot carrier programming for hot-carrier-injection-based FPGA two-transistor memory cells. The memory cells are arranged in segments, and one of the segments 12a of FIG. 2 including sixteen memory cell transistors (the transistors through which the memory cell is programmed) 30a through 30p is shown in FIG. 2. Persons of ordinary skill in the art will recognize that the number of memory cells contained within a segment will largely be a matter of design choice. Persons of ordinary skill in the art will appreciate that the architecture of the present invention applies to non-volatile memory cells such as, but not limited to transistors fabricated using, floating gate, nanocrystal, SONOS and other memory technologies.

From an examination of FIG. 3 it may be seen that memory cell transistors 30a through 30h on the left-hand side of the figure have their sources connected in common to an odd source line 32. Similarly, memory cell transistors 30i through 30p on the right-hand side of the figure have their sources connected in common to an even source line 34.

Odd source line 32 may be coupled to ground by turning on n-channel MOS odd-select transistor 36 and n-channel MOS segment select transistor 38. The gate of n-channel MOS odd-select transistor 36 is coupled to an odd-select signal line 40 and the gate of n-channel MOS segment select transistor 38 is coupled to a segment-select signal line 42.

Even source line 34 may be coupled to ground by turning on n-channel MOS even-select transistor 44 and n-channel MOS segment select transistor 46. The gate of n-channel MOS even-select transistor 44 is coupled to an even-select signal line 48 and the gate of n-channel MOS segment select transistor 46 is also coupled to the segment-select signal line 42.

The control gates of odd-even pairs of the memory cell transistors are connected together. Thus memory cell transistors 30a and 30i have their gates connected together to gate line 50. Similarly memory cell transistor pairs 30b and 30j, 30c and 30k, 30d and 30l, 30e and 30m, 30f and 30n, 30g and 30o, and 30h and 30p have their gates connected together to gate lines 52, 54 56, 58, 60, 62, and 64, respectively. The drains of all of memory cell transistors 30a through 30p are connected together to a common drain line 66.

To program a selected one of the memory cell transistors 30a through 30p, the segment containing the memory cell transistor to be programmed is activated by turning on segment-select transistors 38 and 46. Depending on whether the transistor to be programmed has its source coupled to the odd source line 32 or the even source line 34, one of the odd-select or even-select transistors 36 or 44 is turned on. In the case of FIG. 3 where it is assumed that memory cell transistor 30a is to be programmed, segment-select transistors 38 and 46 are turned on by placing about +5V on segment-select line 42. In addition, the odd-select transistor 36 is turned on by placing a voltage greater than about +5V on its gate at odd-select line 36. A potential of about +8.5V is placed on the control gate line 50 while a potential of about −3V is placed on the other control gate lines 52, 54, 56, 58, 60, 62, and 64. Under these conditions, hot-carrier injection programming will only take place at memory cell transistor 30a.

Because none of the other segments 12b through 12f have been selected, they are not subjected to gate induced drain leakage. In addition, because the segment size can be chosen to be relatively small, the maximum amount of time that memory cell transistors 30b through 30p in the selected segment are subjected to the disturb phenomenon (assuming all of the transistors in the segment are to be programmed) is the time to address and program a single memory cell transistor multiplied by the number of memory cell transistors in a segment.

During normal device operation, the drain line of the memory transistors can be set to zero volts or floating, the segment-select line and the odd-select line and the even-select line may all be set to zero volts, and the control gates can be set to a voltage of at least $V_{DD}$.

Persons of ordinary skill in the art will appreciate that in a programmable logic device such as an FPGA device, at least one nonvolatile switch transistor will usually share a floating gate with each of the memory cell transistors. Each of the switch transistors is used to make a programmable circuit connection and will be turned on or off depending on the programmed state of the memory transistor with which it is associated. Two such nonvolatile switch transistors 68 and 70 are shown sharing a floating gate 72 with memory cell transistor 30p. Other nonvolatile switch transistors coupled to the other memory cell transistors have been omitted from the figure in order to avoid overcrowding the figure.

Using source-side segmentation according to the present invention allows use of smaller segmentation transistors, which, in turn, permits a higher degree of segmentation. The number of bits per column during hot-electron-injection programming and read may therefore be made smaller than normal flash sector size. This further assures a small background leakage and less gate-induced drain leakage (GIDL) disturb during programming.

The source side column select scheme can use self-adapted tunable source side resistors during hot-electron-injection programming by controlling the gate voltage on the odd-select, even-select, and segment-select transistors, resulting in small background leakage and less GIDL disturb during programming.

Unlike the high-voltage or floating gate column select transistor used in the prior art, the stacked odd/even-select transistor and segment select transistor can be implemented using medium voltage transistors. This provides the advantage of saving the expensive well boundary design rules between non-volatile memory transistor wells and high-voltage transistor wells.

Placing the column select device in the source side of the memory transistor can dramatically reduce the select transistor size because the source bias is 0 v during hot-electron-injection programming. This is because there is no back bias effect.

Persons of ordinary skill in the art will appreciate that transistors 38 and 46 and segment select line 42 may be omitted, and that, in such an embodiment, transistors 36 and 44 will need to be high-voltage transistors. If transistors 36 and 44 are formed as floating gate access transistors (floating gate transistors having their floating gate and control gate shorted together), these transistors may be formed in the same well with the memory transistors and the boundary design rule spacing that would otherwise apply can be eliminated.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile memory array segment including:
    an odd-select transistor having a drain coupled to an odd-source line, a source, and a gate coupled to an odd-select signal line;
    an even-select transistor having a drain coupled to an even-source line, a source, and a gate coupled to an even-select signal line;
    a first segment-select transistor having a drain coupled to the source of the odd-select transistor, a source coupled to ground, and a gate coupled to a segment-select line;
    a second segment-select transistor having a drain coupled to the source of the even-select transistor, a source coupled to ground, and a gate coupled to the segment-select line;
    a plurality of odd non-volatile memory transistors, each odd non-volatile memory transistor having a drain coupled to a common drain line, a source coupled to the odd-source line, a floating gate, and a control gate;

a plurality of even non-volatile memory transistors, each even non-volatile memory transistor having a drain coupled to the common drain line, a source coupled to the even-source line, a floating gate, and a control gate, the control gate of each of the even non-volatile memory transistors coupled to the control gate of a different one of the odd non-volatile memory transistors.

2. The non-volatile memory array segment of claim 1 wherein each non-volatile memory transistor shares a floating gate with at least one non-volatile switch transistor.

3. The non-volatile memory array segment of claim 1 wherein at least one of the non-volatile memory transistors shares a floating gate with more than one non-volatile switch transistor.

4. The non-volatile memory array segment of claim 1 wherein the odd and even nonvolatile memory transistors are floating gate transistors.

5. The non-volatile memory array segment of claim 1 wherein the odd and even nonvolatile memory transistors are nanocrystal transistors.

6. The non-volatile memory array segment of claim 1 wherein the odd and even nonvolatile memory transistors are SONOS transistors.

7. A non-volatile memory array including:
   a common drain line;
   an odd-select signal line;
   an even-select signal line;
   a plurality of memory segments, each segment including:
      an odd-select transistor having a drain coupled to an odd-source line, a source, and a gate coupled to the odd-select signal line;
      an even-select transistor having a drain coupled to an even-source line, a source, and a gate coupled to the even-select signal line;
      a first segment-select transistor having a drain coupled to the source of the odd-select transistor, a source coupled to ground, and a gate coupled to a segment-select line;
      a second segment-select transistor having a drain coupled to the source of the even-select transistor, a source coupled to ground, and a gate coupled to the segment-select line;
      a plurality of odd non-volatile memory transistors, each odd non-volatile memory transistor having a drain coupled to the common drain line, a source coupled to the odd-source line, a floating gate, and a control gate;
      a plurality of even non-volatile memory transistors, each even non-volatile memory transistor having a drain coupled to the common drain line, a source coupled to the even-source line, a floating gate, and a control gate, the control gate of each of the even non-volatile memory transistors coupled to the control gate of a different one of the odd non-volatile memory transistors.

8. The non-volatile memory array of claim 7 wherein each non-volatile memory transistor shares a floating gate with at least one non-volatile switch transistor.

9. The non-volatile memory array of claim 7 wherein at least one of the non-volatile memory transistors shares a floating gate with more than one non-volatile switch transistor.

10. The non-volatile memory array segment of claim 7 wherein the odd and even nonvolatile memory transistors are floating gate transistors.

11. The non-volatile memory array segment of claim 7 wherein the odd and even nonvolatile memory transistors are nanocrystal transistors.

12. The non-volatile memory array segment of claim 7 wherein the odd and even nonvolatile memory transistors are SONOS transistors.

* * * * *